(12) United States Patent
Tseng et al.

(10) Patent No.: US 8,765,500 B2
(45) Date of Patent: Jul. 1, 2014

(54) METHOD AND APPARATUS FOR FABRICATING PHOSPHOR-COATED LED DIES

(75) Inventors: Chi-Xiang Tseng, Kaohsiung (TW);
Hsiao-Wen Lee, Hsinchu (TW);
Min-Sheng Wu, Taoyuan County (TW);
Tien-Ming Lin, Chiayi (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 0 days.

(21) Appl. No.: 13/594,219

(22) Filed: Aug. 24, 2012

(65) Prior Publication Data
US 2014/0054616 A1 Feb. 27, 2014

(51) Int. Cl.
*H01L 33/00* (2010.01)
(52) U.S. Cl.
USPC .............. 438/27; 438/29; 438/69; 438/493; 438/507; 438/956; 257/13; 257/79; 257/88; 257/E51.018; 257/E25.032
(58) Field of Classification Search
USPC ................... 257/13, 79–103, 918, 257/E51.018–E51.022, E33.001–E33.077, 257/E33.054, E25.028, E25.032; 438/22–47, 69, 493, 503, 507, 956
See application file for complete search history.

(56) References Cited

U.S. PATENT DOCUMENTS

| 2011/0084296 A1* | 4/2011 | Cheng .............................. 257/98 |
| 2013/0187178 A1* | 7/2013 | Tischler .......................... 257/88 |

\* cited by examiner

*Primary Examiner* — Mamadou Diallo
(74) *Attorney, Agent, or Firm* — Haynes and Boone, LLP

(57) ABSTRACT

The present disclosure involves a method of packaging a light-emitting diode (LED). According to the method, a group of metal pads and a group of LEDs are provided. The group of LEDs is attached to the group of metal pads, for example through a bonding process. After the LEDs are attached to the metal pads, each LED is spaced apart from adjacent LEDs. Also according to the method, a phosphor film is coated around the group of LEDs collectively. The phosphor film is coated on top and side surfaces of each LED and between adjacent LEDs. A dicing process is then performed to slice through portions of the phosphor film located between adjacent LEDs. The dicing process divides the group of LEDs into a plurality of individual phosphor-coated LEDs.

20 Claims, 15 Drawing Sheets

METHOD AND APPARATUS FOR FABRICATING PHOSPHOR-COATED LED DIES

TECHNICAL FIELD

The present disclosure relates generally to light-emitting devices, and more particularly, to the fabrication of phosphor-coated light-emitting diode (LED) dies.

BACKGROUND

LEDs are semiconductor photonic devices that emit light when a voltage is applied. LEDs have increasingly gained popularity due to favorable characteristics such as small device size, long lifetime, efficient energy consumption, and good durability and reliability. In recent years, LEDs have been deployed in various applications, including indicators, light sensors, traffic lights, broadband data transmission, back light unit for LCD displays, and other suitable illumination apparatuses. For example, LEDs are often used in illumination apparatuses provided to replace conventional incandescent light bulbs, such as those used in a typical lamp.

To configure the color of the light output from an LED, a photoconversion material such as phosphor may be utilized to change the light output from one color to another. However, conventional methods and techniques of applying photoconversion materials to LEDs suffer from drawbacks such as low throughput and high cost.

Therefore, although existing methods of applying photoconversion materials to LEDs have been generally adequate for their intended purposes, they have not been entirely satisfactory in every aspect. A cheaper and more efficient way of applying photoconversion materials to LEDs continues to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not necessarily drawn to scale or according to the exact geometries. In fact, the dimensions of the various features may be arbitrarily increased or reduced for clarity of discussion.

DETAILED DESCRIPTION

Figure 1:
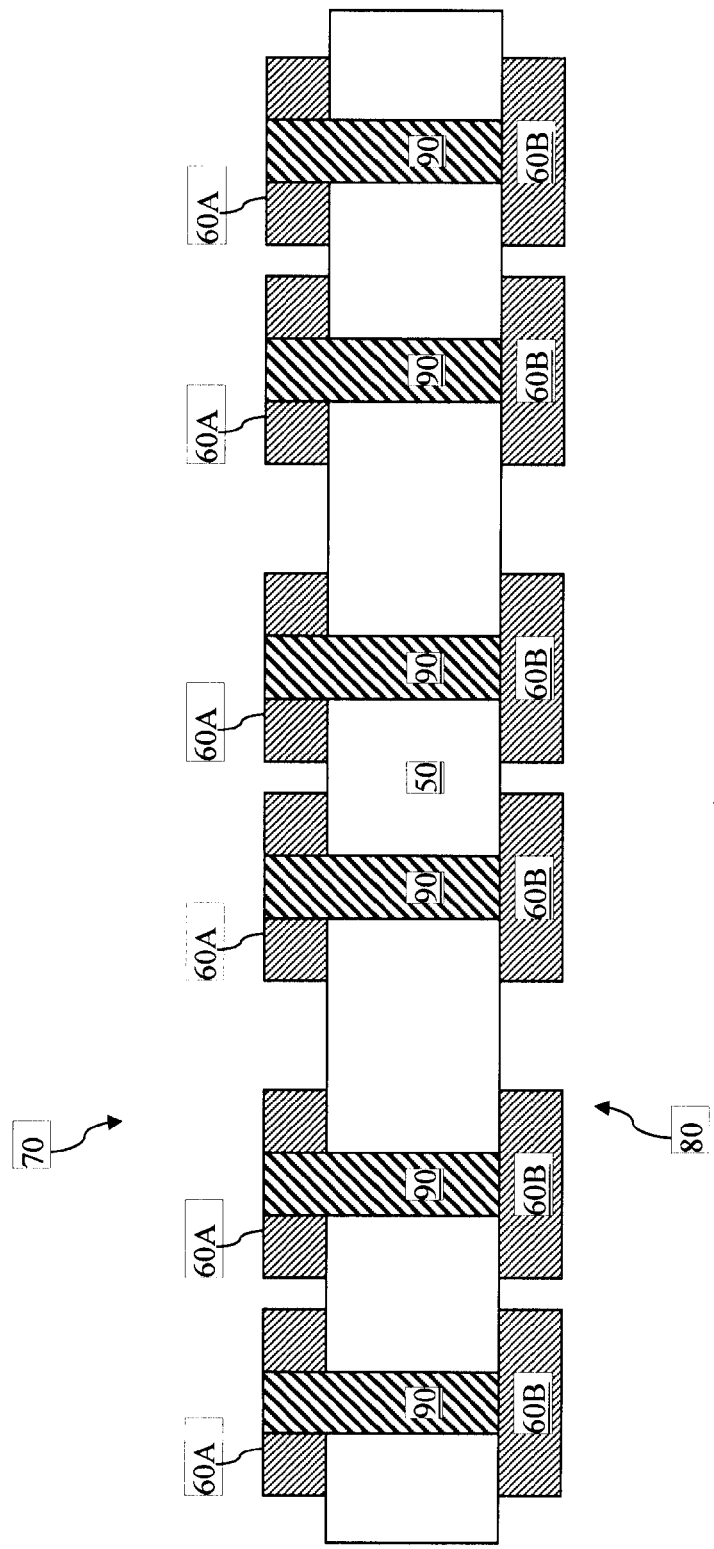
FIGS. 1-4 are diagrammatic fragmentary cross-sectional side views of a plurality of LEDs undergoing a packaging process according to some embodiments of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the terms "top," "bottom," "under," "over," and the like are used for convenience and are not meant to limit the scope of embodiments to any particular orientation. Various features may also be arbitrarily drawn in different scales for the sake of simplicity and clarity. In addition, the present disclosure may repeat reference numerals and/or letters in the various examples. This repetition is for the purpose of simplicity and clarity and does not in itself necessarily dictate a relationship between the various embodiments and/or configurations discussed.

Semiconductor devices can be used to make photonic devices, such as light-emitting diodes (LEDs). When turned on, LEDs may emit radiation such as different colors of light in a visible spectrum, as well as radiation with ultraviolet or infrared wavelengths. Compared to traditional light sources (e.g., incandescent light bulbs), lighting instruments using LEDs as light sources offer advantages such as smaller size, lower energy consumption, longer lifetime, variety of available colors, and greater durability and reliability. These advantages, as well as advancements in LED fabrication technologies that have made LEDs cheaper and more robust, have added to the growing popularity of LED-based lighting instruments in recent years.

As light sources, LED dies or emitters may not naturally emit the color of light that is desirable for a lighting instrument. For example, many LED emitters naturally emit blue light. However, it is desirable for an LED-based lighting instrument to produce a light that is closer to a white light, so as to emulate the light output of traditional lamps. Therefore, photoconversion materials such as phosphor have been used to reconfigure the light output color from one to another. For example, a yellow phosphor material can change the blue light emitted by an LED die to a color close to white.

However, traditional methods of applying photoconversion materials on LED dies have certain drawbacks. For example, these traditional methods do not offer the capability of applying the photoconversion material to LEDs on a die level or a chip level. As such, the traditional methods of applying photoconversion materials on LED dies may be expensive and inefficient.

According to various aspects of the present disclosure, described below is a method of applying a photoconversion material to LEDs on a die level or a chip level, which enhances throughput and reduces waste.

In more detail, FIGS. 1-4 are simplified diagrammatic cross-sectional side views of a plurality of LEDs at various stages of packaging according to some embodiments of the present disclosure. Referring to FIG. 1, a submount 50 (also referred to as a substrate) is provided. In some embodiments, the submount 50 may be a silicon submount. In other embodiments, the submount 50 may be a ceramic submount or a printed circuit board (PCB). The submount 50 provides mechanical strength and support for the subsequent packaging processes.

A plurality of conductive pads 60 is disposed on both sides of the submount 50. For example, the conductive pads 60A are disposed on a front side 70 of the submount 50, and the conductive pads 60B are disposed on a back side 80 of the submount 50. The conductive pads 60A-60B are thermally and electrically conductive. In some embodiments, the conductive pads 60A-60B include metal, for example copper, aluminum, or another suitable metal.

Each pair of the conductive pads 60A-60B is interconnected by a respective via 90 that extends through the substrate 50. The via 90 contains a thermally and electrically conductive material as well, for example a suitable metal material.

Figure 2:
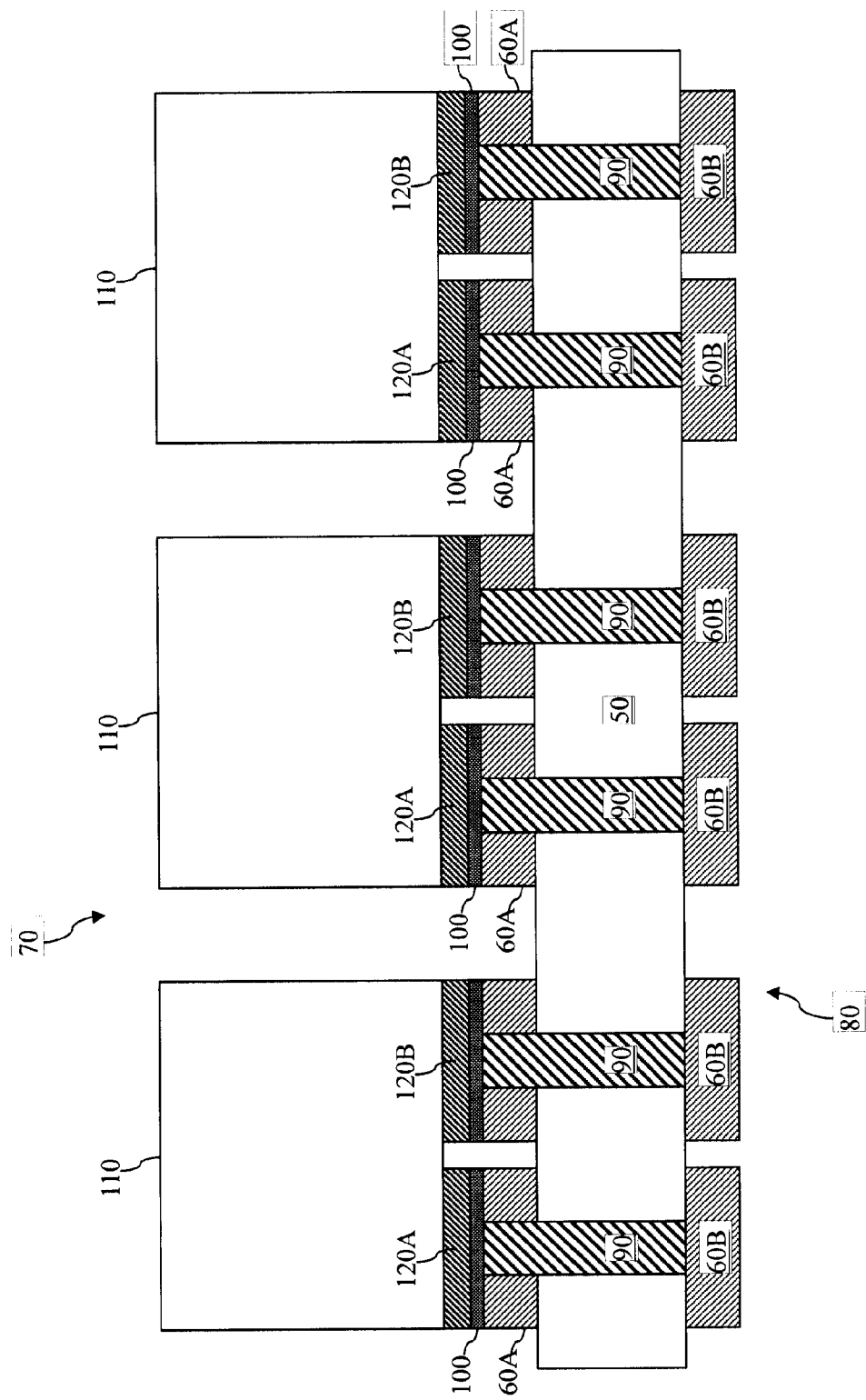

Referring now to FIG. 2, a solder paste 100 is applied on each of the conductive pads 60A from the front side 70. The solder paste 100 may contain powdered metal solder in a viscous medium such as flux. The solder paste 100 is applied for bonding the conductive pads 60A to other components, as discussed below.

A plurality of semiconductor photonic dies 110 are bonded to the conductive pads 60A through the solder paste 100. The semiconductor photonic dies 110 function as light sources for a lighting instrument. The semiconductor photonic dies 110 are LED dies in the embodiments described below, and as such may be referred to as LED dies 110 in the following paragraphs. As shown in FIG. 2, the LED dies 110 are physically spaced apart from one another. In some embodiments, the LED dies 110 are substantially evenly spaced apart from adjacent LED dies.

The LED dies 110 each include two differently doped semiconductor layers. Alternatively stated, these oppositely doped semiconductor layers have different types of conductivity. For example, one of these semiconductor layers contains a material doped with an n-type dopant, while the other one of the two semiconductor layers contains a material doped with a p-type dopant. In some embodiments, the oppositely doped semiconductor layers each contain a "III-V" family (or group) compound. In more detail, a III-V family compound contains an element from a "III" family of the periodic table, and another element from a "V" family of the periodic table. For example, the III family elements may include Boron, Aluminum, Gallium, Indium, and Titanium, and the V family elements may include Nitrogen, Phosphorous, Arsenic, Antimony, and Bismuth. In certain embodiments, the oppositely doped semiconductor layers include a p-doped gallium nitride (p-GaN) material and an n-doped gallium nitride material (n-GaN), respectively. The p-type dopant may include Magnesium (Mg), and the n-type dopant may include Carbon (C) or Silicon (Si).

The LED dies 110 also each include a light emitting layer such as a multiple-quantum well (MQW) layer that is disposed in between the oppositely doped layers. The MQW layer includes alternating (or periodic) layers of active material, such as gallium nitride and indium gallium nitride (InGaN). For example, the MQW layer may include a number of gallium nitride layers and a number of indium gallium nitride layers, wherein the gallium nitride layers and the indium gallium nitride layers are formed in an alternating or periodic manner. In some embodiments, the MQW layer includes ten layers of gallium nitride and ten layers of indium gallium nitride, where an indium gallium nitride layer is formed on a gallium nitride layer, and another gallium nitride layer is formed on the indium gallium nitride layer, and so on and so forth. The light emission efficiency depends on the number of layers of alternating layers and thicknesses. In certain alternative embodiments, suitable light-emitting layers other than an MQW layer may be used instead.

Each LED die may also include a pre-strained layer and an electron-blocking layer. The pre-strained layer may be doped and may serve to release strain and reduce a Quantum-Confined Stark Effect (QCSE)—describing the effect of an external electric field upon the light absorption spectrum of a quantum well—in the MQW layer. The electron blocking layer may include a doped aluminum gallium nitride (AlGaN) material, wherein the dopant may include Magnesium. The electron blocking layer helps confine electron-hole carrier recombination to within the MQW layer, which may improve the quantum efficiency of the MQW layer and reduce radiation in undesired bandwidths.

The doped layers and the MQW layer may all be formed by one or more epitaxial growth processes known in the art. For example, these layers may be formed by processes such as metal organic vapor phase epitaxy (MOVPE), molecular-beam epitaxy (MBE), metal organic chemical vapor deposition (MOCVD), hydride vapor phase epitaxy (HVPE), liquid phase epitaxy (LPE), or other suitable processes. These processes may be performed at suitable deposition processing chambers and at high temperatures ranging from a few hundred degrees Celsius to over one thousand degrees Celsius.

After the completion of the epitaxial growth processes, an LED is created by the disposition of the MQW layer between the doped layers. When an electrical voltage (or electrical charge) is applied to the doped layers of the LED 110, the MQW layer emits radiation such as light. The color of the light emitted by the MQW layer corresponds to the wavelength of the radiation. The radiation may be visible, such as blue light, or invisible, such as ultraviolet (UV) light. The wavelength of the light (and hence the color of the light) may be tuned by varying the composition and structure of the materials that make up the MQW layer. For example, the LED dies 110 herein may be blue LED emitters, in other words, they are configured to emit blue light.

As shown in FIG. 2, each LED die 110 also includes two conductive terminals 120A and 120B, which may include metal pads. Each conductive terminal 120A/120B is bonded to a respective one of the conductive pads 60A (through the solder paste 100). Since the conductive pads 60A on the front side 70 are electrically coupled to the conductive pads 60B on the back side 80, electrical connections to the LED dies 110 may be established through the conductive terminals 120A/120B from the conductive pads 60B. In the embodiments discussed herein, one of the conductive terminals 120A/120B is a p-terminal (i.e., electrically coupled to the p-GaN layer of the LED die 110), and the other one of the conductive terminals 120A/120B is an n-terminal (i.e., electrically coupled to the n-GaN layer of the LED die 110). Thus, an electrical voltage can be applied across the terminals 120A and 120B (through the conductive pads 60B) to generate light a light output from the LED die 110.

In certain embodiments, the LED dies 110 shown herein have already undergone a binning process. In more detail, a plurality of LED dies has been fabricated using standard LED fabrication processes. These LED dies may have varying performance characteristics in different areas such as light output intensity, color, current consumption, leakage, resistance, etc. A binning process involves dividing or assigning these LED dies into different categories (or bins) according to each die's performance in these performance areas. For example, a bin 1 may include LED dies that have a light output density that meets a predefined threshold, a bin 10 may include LED dies that have serious performance failures and thus need to be discarded, so on and so forth. After the LED dies are binned, a subset of the LED dies from one or more certain bins are chosen to be attached herein as the LED dies 110. The selected subset of LED dies 110 may also be referred to as reconstructed LED dies.

Figure 3:
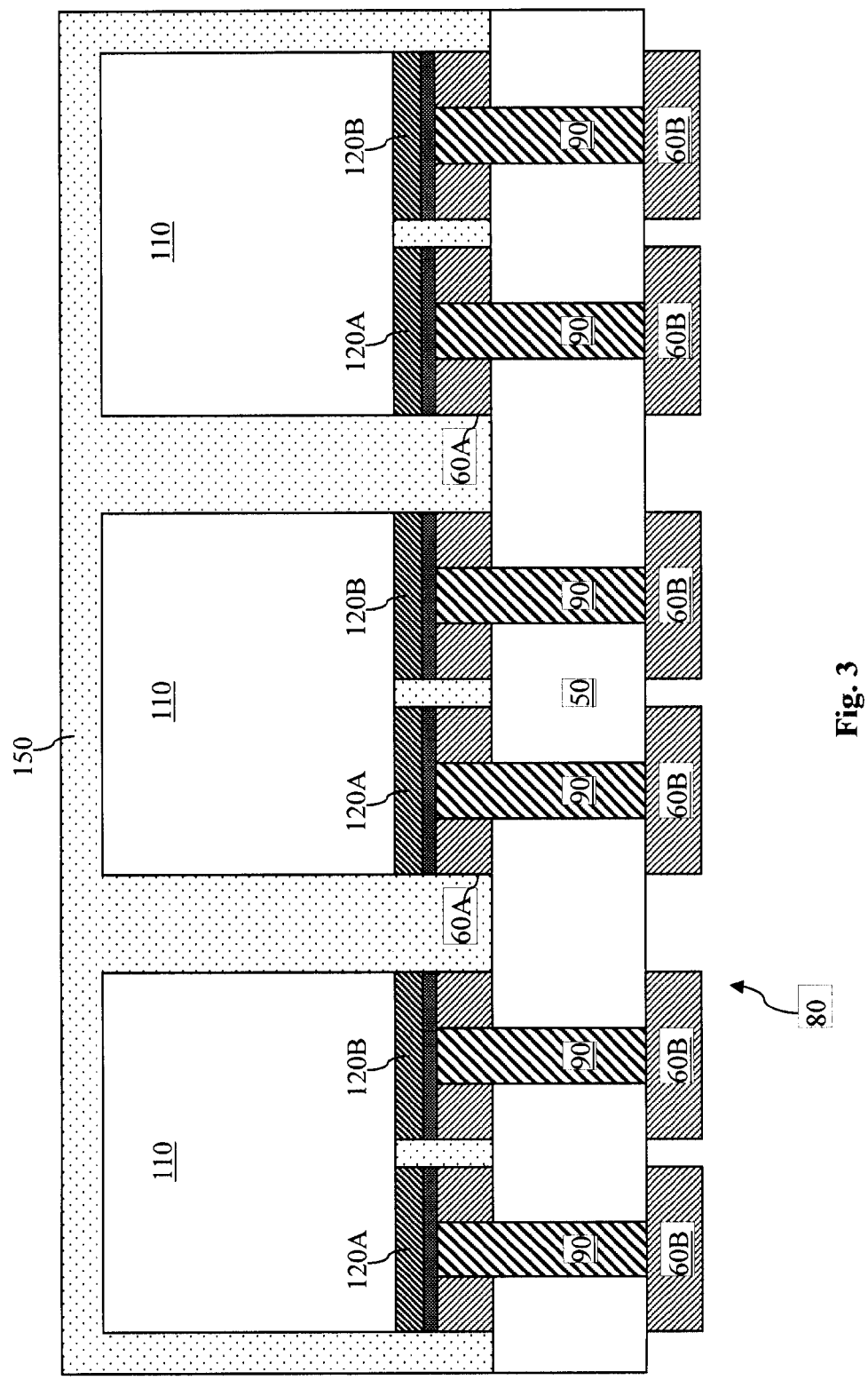

Referring now to FIG. 3, a photoconversion material such as a phosphor film 150 is applied to the LED dies 110 collectively. In more detail, the phosphor film 150 is coated around the exposed surfaces of the LED dies 110, as well as on the exposed surfaces of the conductive pads 60A and the substrate 50. The phosphor film 150 may include either phosphorescent materials and/or fluorescent materials. The phosphor film 150 is used to transform the color of the light emitted by an LED dies 110. In some embodiments, the phosphor film 150 contains yellow phosphor particles and can transform a blue light emitted by an LED die 110 into a different wavelength light. By changing the material composition of the phosphor film 150, the desired light output color (e.g., a color resembling white) may be achieved. The phosphor film 150 may be coated on the surfaces of the LED dies 110 in a concentrated viscous fluid medium (e.g., liquid glue). As the viscous liquid sets or cures, the phosphor material becomes a part of the LED package.

Wafer back side probing may also be performed at this stage. In other words, the LED dies 110 may be electrically accessed from the back side 80 of the wafer through the conductive pads 60B. This back side probing process may be done to evaluate the light output performance from the LED dies 110, for example performance with respect to the color temperature of the LED dies 110, etc. If the light output performance is unsatisfactory, the recipe for the phosphor material 150 may be modified to improve the light output performance.

Figure 4:
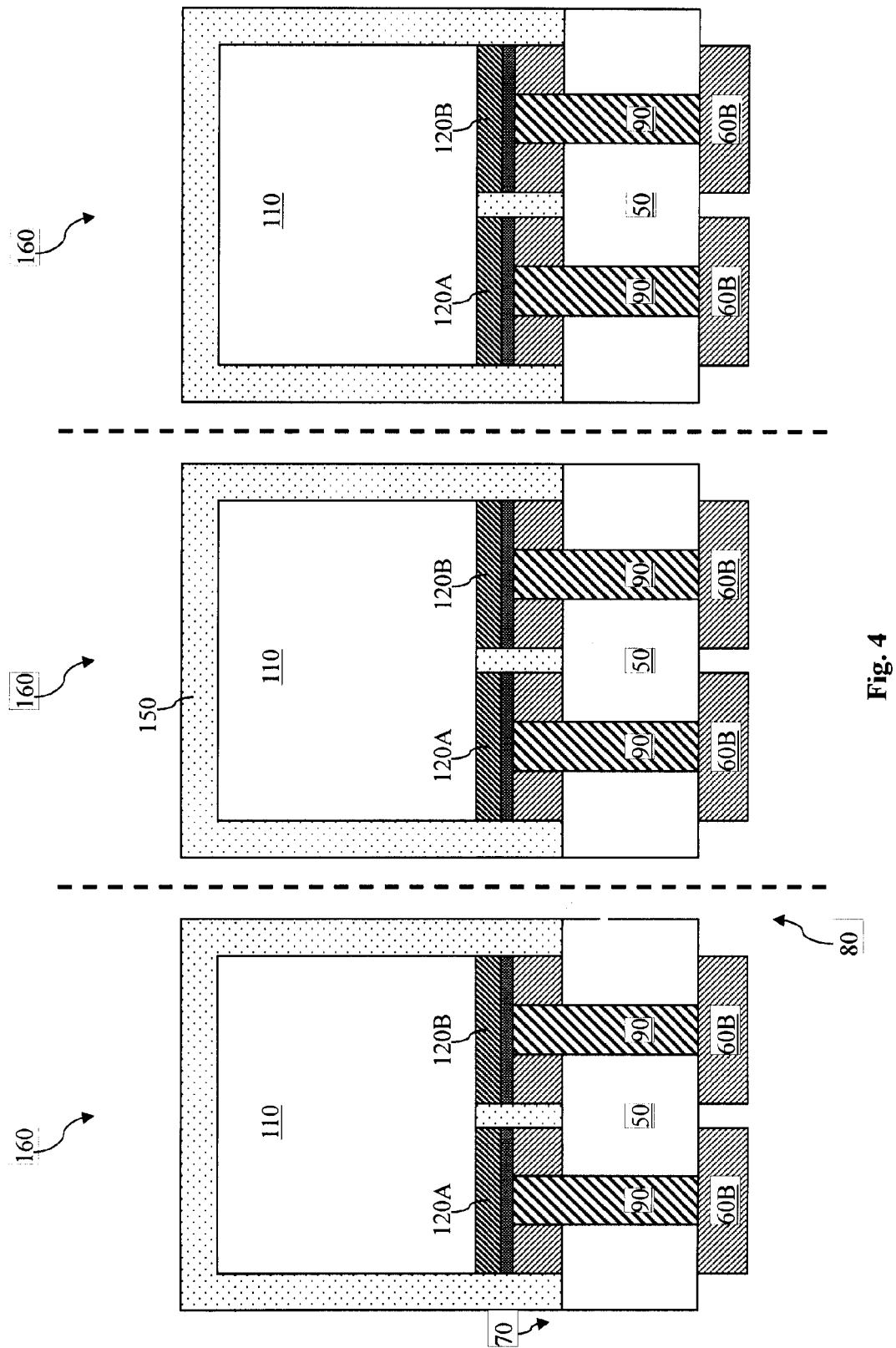

Referring now to FIG. 4, a wafer dicing process is performed to the LED dies 110 (and to the substrate 50 and the attached conductive pads 60). The wafer dicing process includes slicing portions of the phosphor material 150 between adjacent LED dies 110. The substrate 50 is also sliced completely through from the front side 70 to the back side 80. Thus, as a result of the wafer dicing process, a plurality of LED chips 160 is created by the sliced pieces of the LED dies 110 and the attached portions of the substrate 50 and the conductive pads 60. Each LED chip 160 may also be referred to as a single junction phosphor chip or package. The phosphor coating for these LED chips 160 is applied on a die level. In other words, the phosphor coating is collectively applied to all the LED dies 110 before these LED dies are diced and undergo individual package processing. As is shown in FIG. 4, the phosphor material is now conformally coated around each LED die 110. The resulting LED chip 160 can achieve small dimensions too. In some embodiments, a footprint of the LED chip 160 ranges from about (1-2 millimeters)×(1-2 millimeters).

Figure 5:
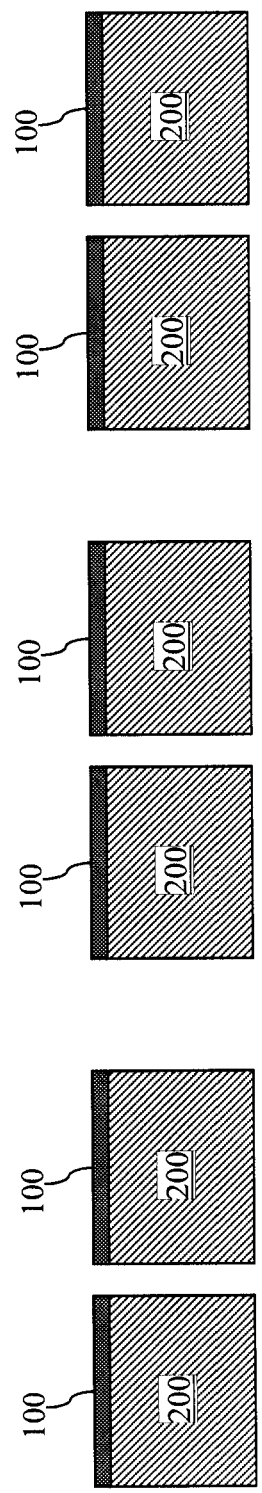
FIGS. 5-8 are diagrammatic fragmentary cross-sectional side views of a plurality of LEDs undergoing a packaging process according to some other embodiments of the present disclosure.

FIGS. 5-8 are simplified diagrammatic cross-sectional side views of a plurality of LEDs at various stages of packaging according to some alternative embodiments of the present disclosure. For reasons of clarity and consistency, similar components will be labeled the same throughout the different embodiments illustrated in FIGS. 1-8. Referring to FIG. 5, a plurality of conductive pads 200 are provided without using a substrate (such as the substrate 50 of FIG. 1). In some embodiments, the conductive pads 200 include lead frames, such as silver platting. A solder paste 100 is applied on each conductive pad 200.

Figure 6:
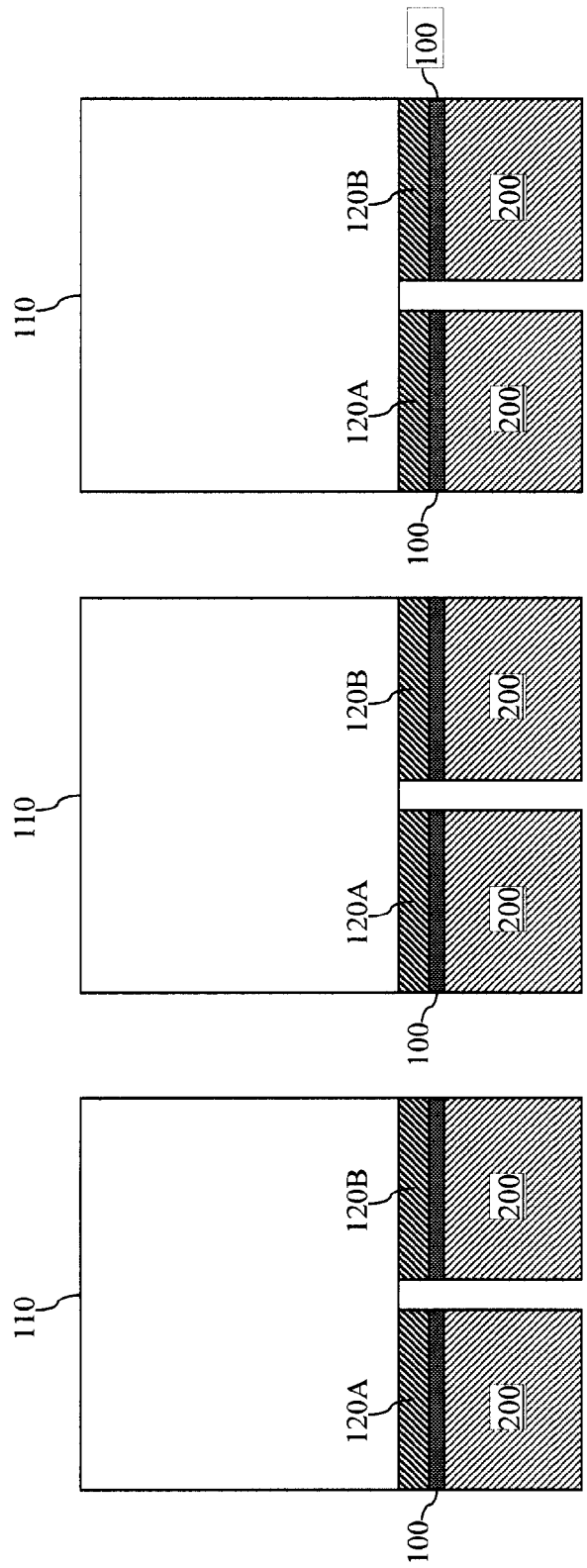

Referring now to FIG. 6, a plurality of LED dies 110 is bonded to the conductive pads 200 through the solder paste 100. As discussed above, these LED dies 110 may belong to a "binned" subset of a greater number of LED dies. Each LED die 110 has two conductive terminals 120A and 120B, one of which is the p-terminal, and the other one of which is the n-terminal. Thus, electrical access to the LED die may be established through these terminals 120A/120B and the conductive pads 200 electrically coupled to the terminals 120A/120B.

Figure 7:
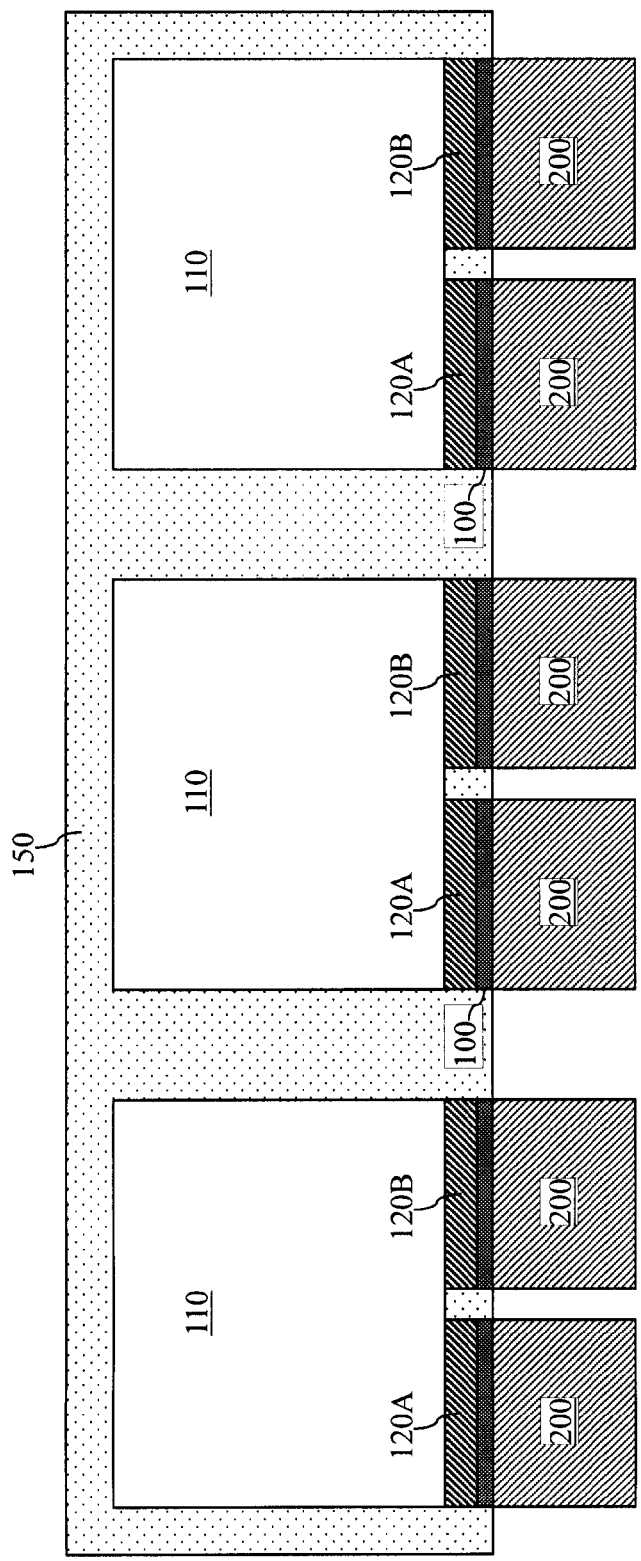

Referring now to FIG. 7, a photoconversion material 150 such as a phosphor film is coated around all the LED dies 110 collectively. Similar to the embodiments of FIGS. 1-4, the phosphor coating here is done at a die level. Wafer probing may be performed at this stage in order to tune the phosphor recipe.

Figure 8:
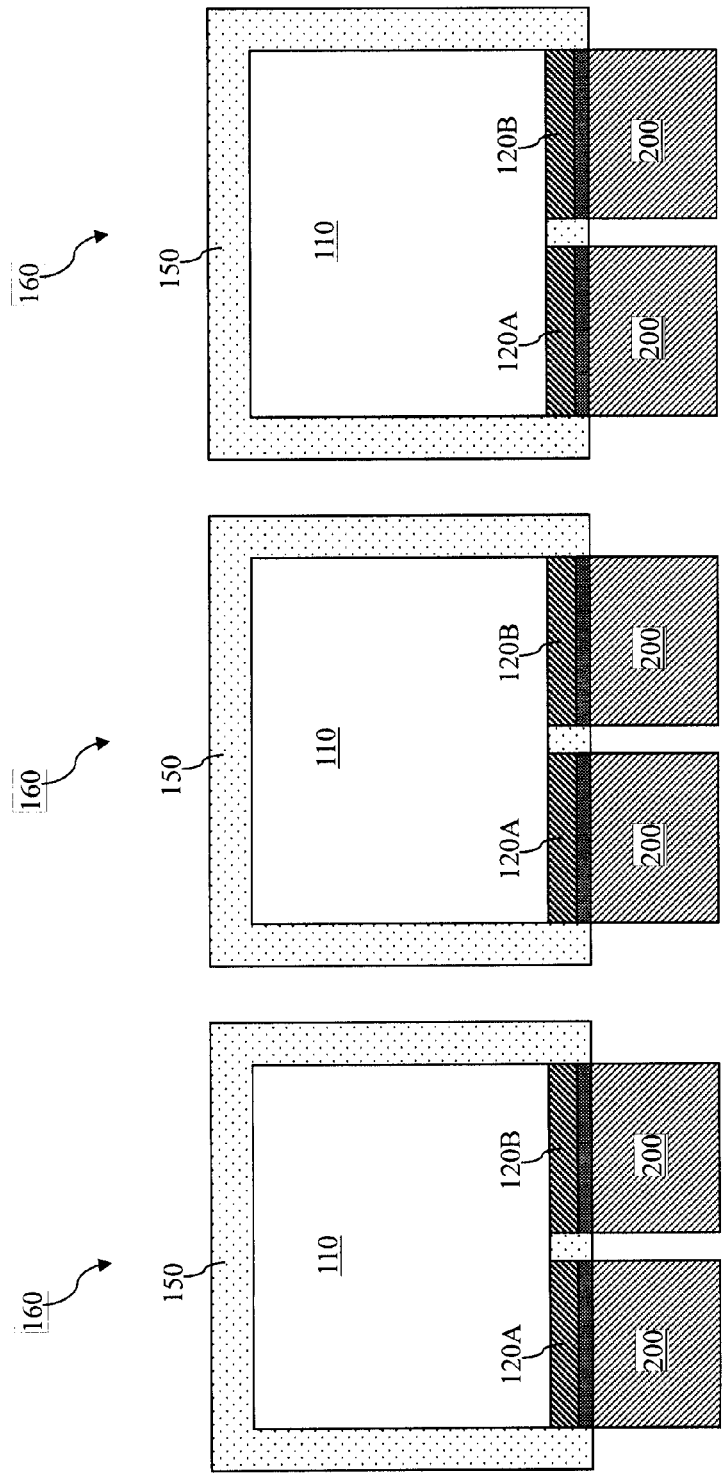

Referring now to FIG. 8, a dicing process is performed to form individual LED chips 160. As a part of the dicing process, the phosphor material 150 between adjacent LED dies 110 is sliced completely through to separate the LED dies 110. In this manner, a plurality of single junction phosphor chips 160 is created. Each chip 160 includes an LED die 110 on which a phosphor film 150 is conformally coated. In some embodiments, a footprint of the chip 160 ranges from about (1-2 millimeters)×(1-2 millimeters).

Figure 9:
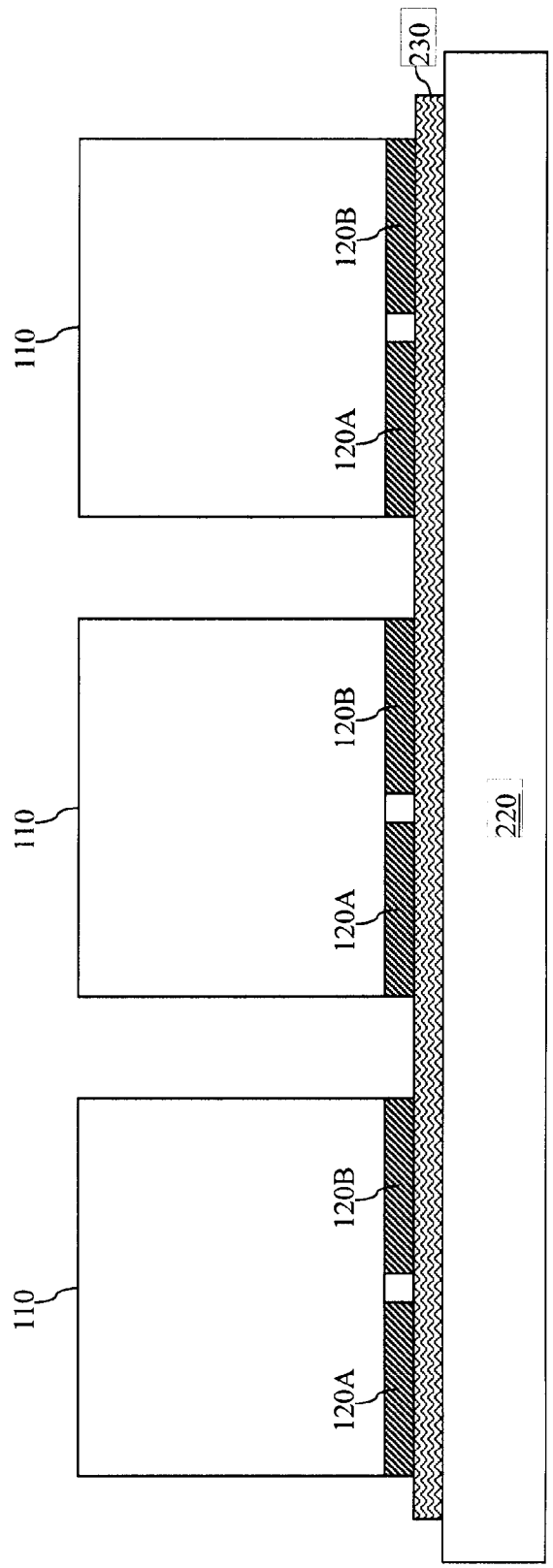
FIGS. 9-11 are diagrammatic fragmentary cross-sectional side views of a plurality of LEDs undergoing a packaging process according to other embodiments of the present disclosure.
Figure 10:
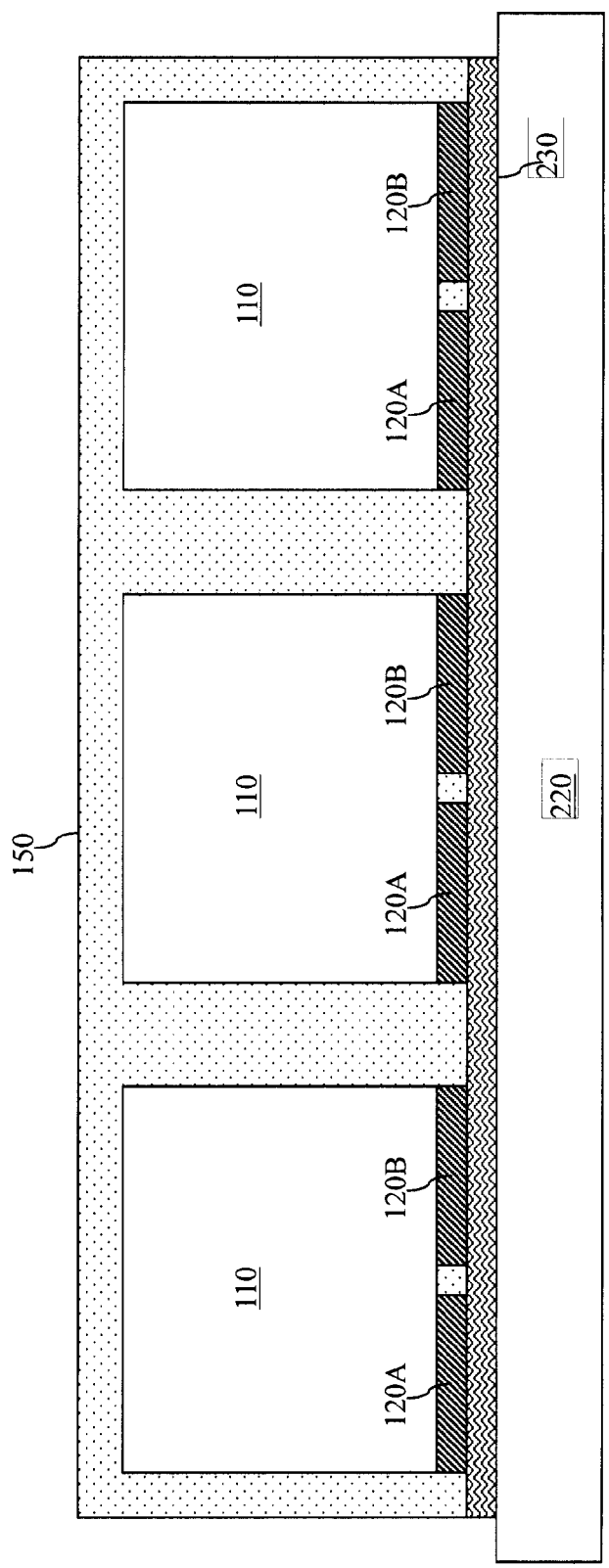
Figure 11:
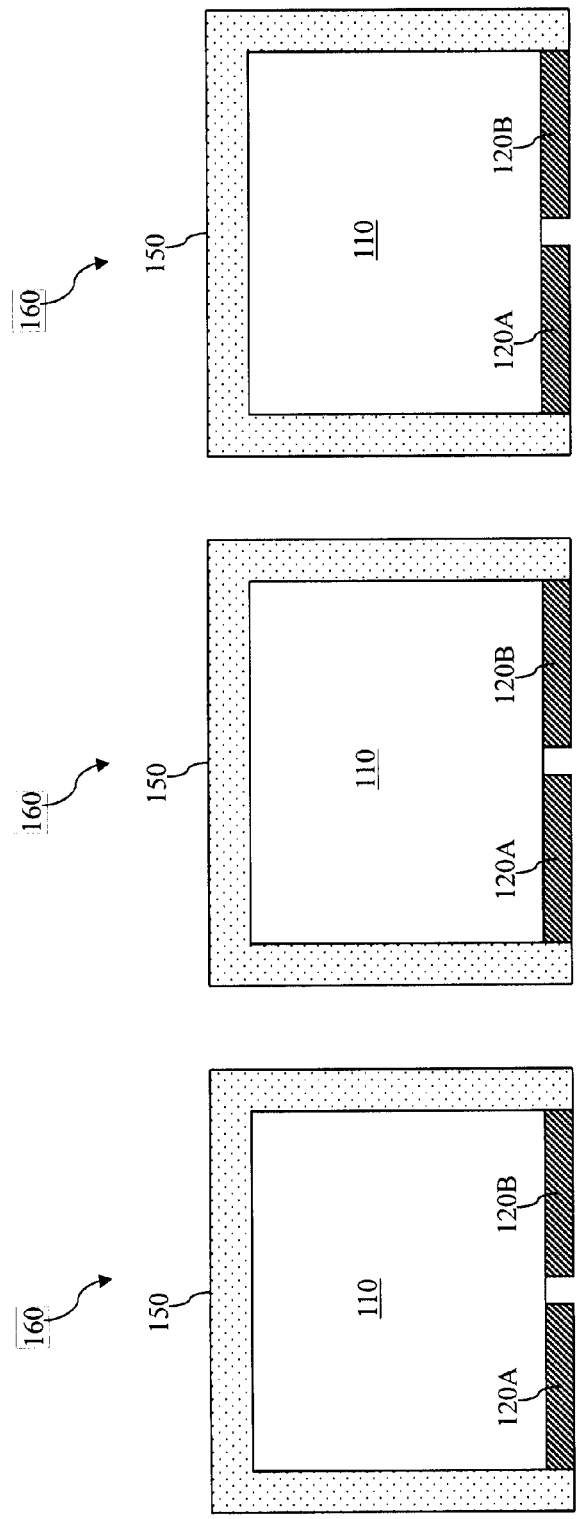

FIGS. 9-11 are simplified diagrammatic cross-sectional side views of a plurality of LEDs at various stages of packaging according to some alternative embodiments of the present disclosure. For reasons of clarity and consistency, similar components will be labeled the same throughout the different embodiments illustrated in FIGS. 1-11. Referring to FIG. 9, a substrate 220 is provided. The substrate 220 may include a silicon substrate, a ceramic substrate, a gallium nitride substrate, or any other suitable substrate that can provide mechanical strength and support.

A tape 230 is disposed on the substrate 220. A plurality of LED dies 110 is disposed on the tape 230. As discussed above, these LED dies 110 may belong to a "binned" subset of a greater number of LED dies. Each LED die 110 has two conductive terminals 120A and 120B, one of which is the p-terminal, and the other one of which is the n-terminal. Thus, electrical access to the LED die may be established through these terminals 120A/120B.

Referring now to FIG. 10, a photoconversion material 150 such as a phosphor film is coated around all the LED dies 110 collectively. Similar to the embodiments of FIGS. 1-4 and 5-8, the phosphor coating here is done at a die level. Wafer probing may be performed at this stage in order to tune the phosphor recipe.

Referring now to FIG. 11, the substrate 220 and the tape 230 are removed. A dicing process is then performed to form individual LED chips 160. As a part of the dicing process, the phosphor material 150 between adjacent LED dies 110 is sliced completely through to separate the LED dies 110. In this manner, a plurality of single junction phosphor chips 160 is created. Each chip 160 includes an LED die 110 on which a phosphor film 150 is conformally coated. In some embodiments, a footprint of the chip 160 ranges from about (1-2 millimeters)×(1-2 millimeters).

The embodiments of the present disclosure discussed above offer advantages over existing methods. However, not all advantages are discussed herein, other embodiments may offer different advantages, and that no particular advantage is required for any embodiment.

One of the advantages of the embodiments of the present disclosure is that the phosphor coating can be done at a die level. In other words, the phosphor coating can be applied to all the LEDs collectively. A plurality of phosphor-coated LED dies is then formed by the subsequent dicing process. By doing so, the phosphor coating is fast and efficient, whereas conventional methods laborious processes that apply phosphor to each LED die. Furthermore, since the embodiments of the present disclosure allow phosphor film to be conformally coated around each LED die, the photoconversion efficiency is improved, and very little phosphor material is wasted. In comparison, some existing methods of applying phosphor to LED dies may result in a significant amount of phosphor material being wasted. In addition, the embodiments of the present disclosure entail flexible processes that can be easily integrated into existing LED fabrication process flow.

Figure 12:
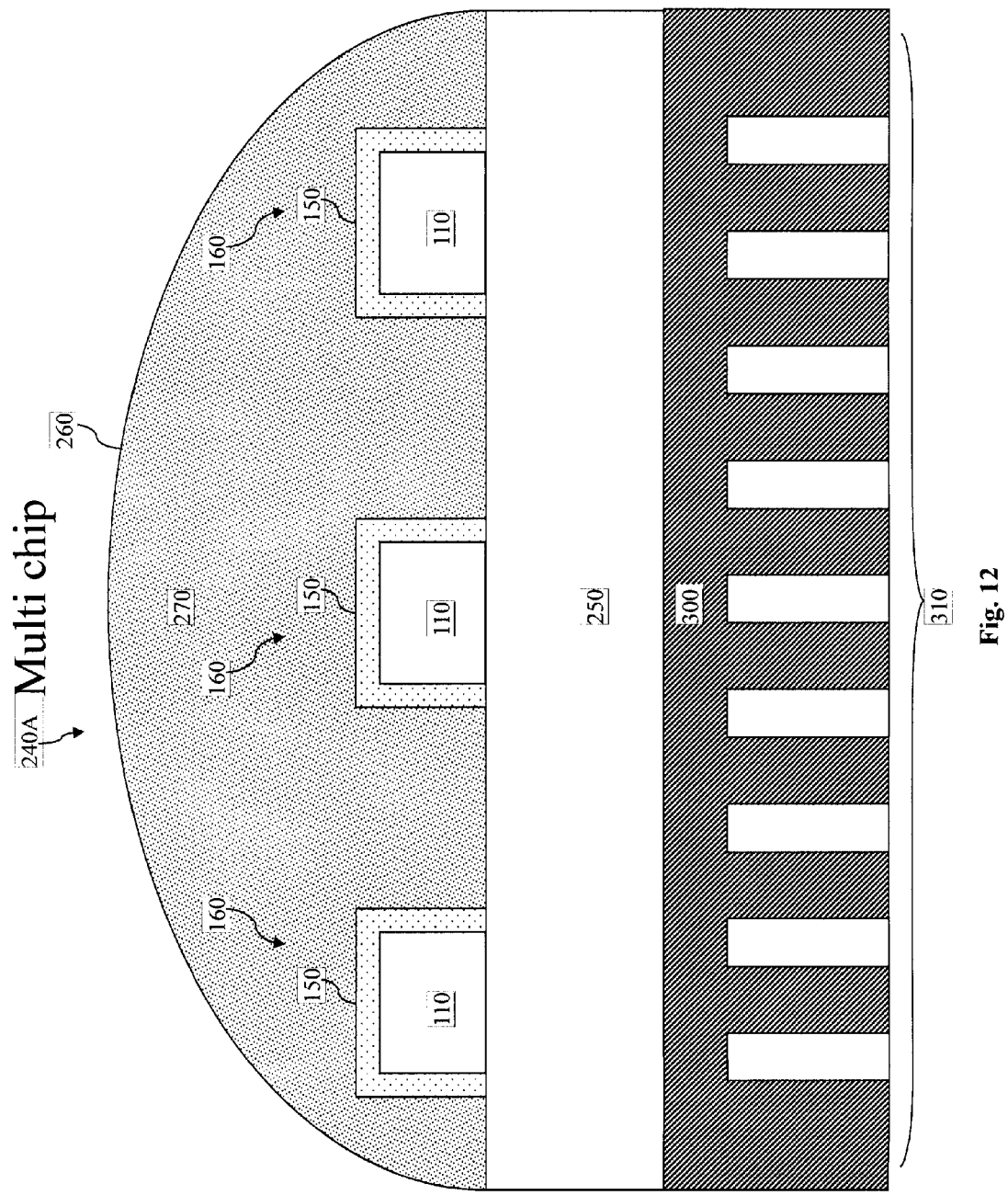
FIG. 12 is a diagrammatic fragmentary cross-sectional side view of an example lighting apparatus according to various aspects of the present disclosure.

Referring now to FIG. 12, discussed below is an example multi-chip lighting instrument 240A using the single junction phosphor LED chips 160 according to various embodiments of the present disclosure. The lighting instrument 240A includes a substrate 250. In some embodiments, the substrate 250 includes a Metal Core Printed Circuit Board (MCPCB). The MCPCB includes a metal base that may be made of Aluminum (or an alloy thereof). The MCPCB also includes a thermally conductive but electrically insulating dielectric layer disposed on the metal base. The MCPCB may also include a thin metal layer made of copper that is disposed on the dielectric layer. In other embodiments, the substrate 250 may include other suitable materials, for example ceramic or silicon. The substrate 250 may contain active circuitry and may also be used to establish interconnections.

As the name implies, the multi-chip lighting instrument 240A includes a plurality of LED dies 110. The LED dies 110 are parts of the single junction phosphor-coated LED chips 160 discussed above. For reasons of simplicity, the conductive terminals of the LED chips 160 are not shown herein. In the embodiments discussed herein, the LED dies 110 are physically spaced apart from one another.

The lighting instrument 240A also includes a diffuser cap 260. The diffuser cap 260 provides a cover for the LED dies 110 located on the substrate 250. Stated differently, the LED dies 110 may be encapsulated by the diffuser cap 260 and the substrate 250 collectively. The substrate 250 may or may not be completely covered by the diffuser cap 260. In some embodiments, the diffuser cap 260 has a curved surface or profile. In some embodiments, the curved surface may substantially follow the contours of a semicircle, so that each beam of light emitted by the LED dies 110 may reach the surface of the diffuser cap 260 at a substantially right incident angle, for example, within a few degrees of 90 degrees. The curved shape of the diffuser cap 260 helps reduce Total Internal Reflection (TIR) of the light emitted by the LED dies 110. In some embodiments, the diffuser cap 260 has a textured surface for further scattering of the incident light.

In some embodiments, the space between the LED dies 110 and the diffuser cap 260 may be filled by an optical-grade silicone-based adhesive material 270, also referred to as an optical gel 270. Diffuser particles may be mixed within the optical gel 270 in these embodiments so as to further diffuse light emitted by the LED dies 110. In other embodiments, the space between the LED dies 110 and the diffuser cap 260 may be filled by air.

The substrate 250 is located on a thermal dissipation structure 300, also referred to as a heat sink 300. The heat sink 300 is thermally coupled to the LED dies 110 through the substrate 250. The heat sink 300 is configured to facilitate heat dissipation to the ambient atmosphere. The heat sink 300 contains a thermally conductive material, such as a metal material. The shape and geometries of the heat sink 300 may be designed to provide a framework for a familiar light bulb while at the same time spreading or directing heat away from the LED dies 110. To enhance heat transfer, the heat sink 300 may have a plurality of fins 310 that protrude outwardly from a body of the heat sink 300. The fins 310 may have substantial surface area exposed to ambient atmosphere to facilitate heat transfer. In some embodiments, a thermally conductive material may be disposed between the substrate 250 and the heat sink 300. For example, the thermally conductive material may include thermal grease, metal pads, solder, etc. The thermally conductive material further enhances heat transfer from the LED dies 110 to the heat sink 300.

Figure 13:
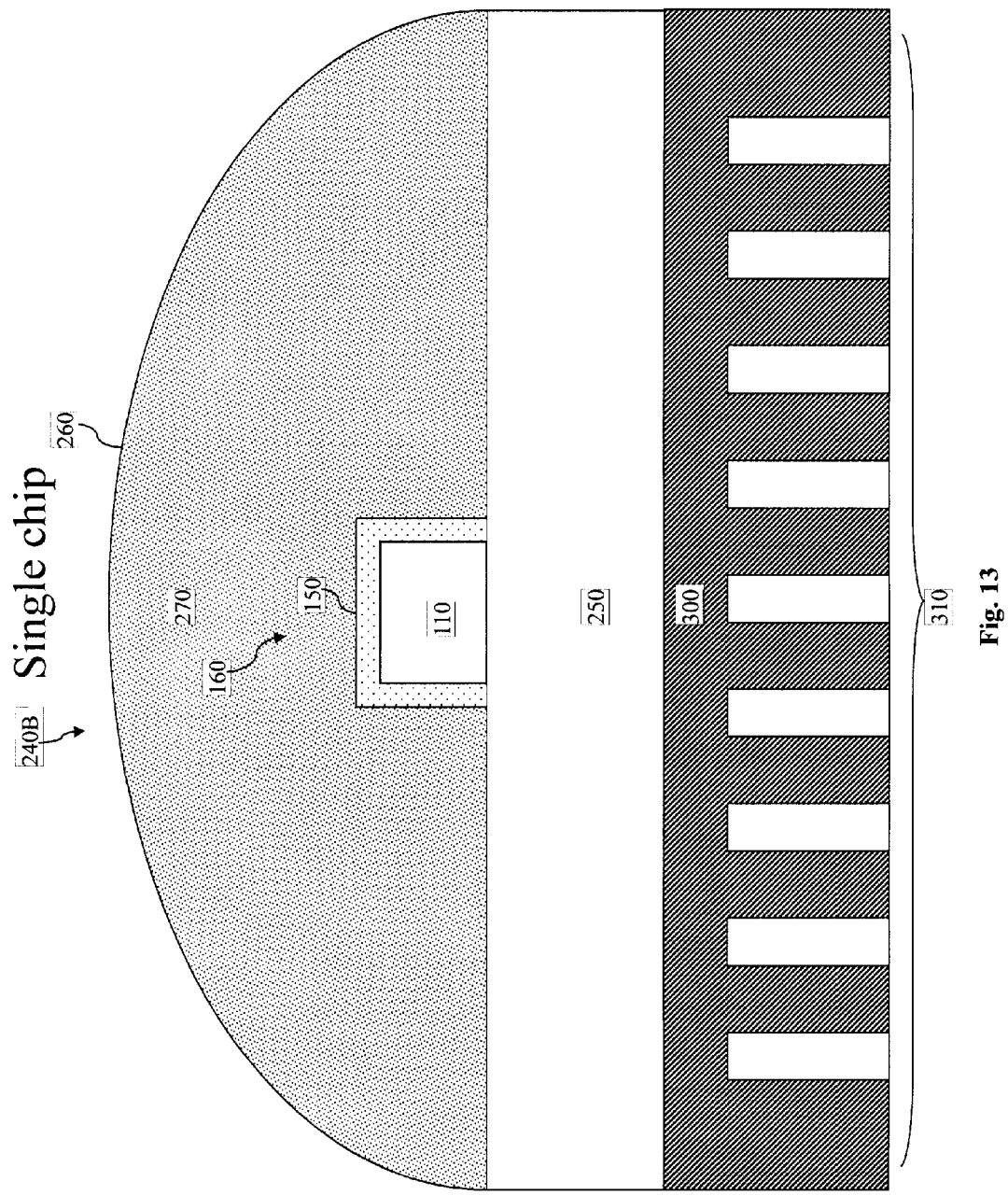
FIG. 13 is a diagrammatic fragmentary cross-sectional side view of another example lighting apparatus according to various aspects of the present disclosure.

In addition to a multi-chip lighting instrument, the concepts of the present disclosure may also apply to a single-chip lighting instrument, for example a single-chip lighting instrument 240B shown in FIG. 13. Instead of using a plurality of LEDs as light sources (such as the multi-chip lighting instrument 240A of FIG. 12), the single-chip lighting instrument 240B includes a single LED chip 160 to generate light. Similar to the multi-chip lighting instrument 240A, the single-chip lighting instrument 240B includes a substrate 250 for housing additional electronic circuitry and providing interconnections, a diffuser cap 260 for optical considerations, an optical gel disposed between the diffuser cap 260 and the substrate 250, and a heat sink 300 for thermal dissipation. The single-chip lighting instrument 240B may include additional components for facilitating lighting output, but these additional components are not discussed in detail herein for reasons of simplicity.

Figure 14:
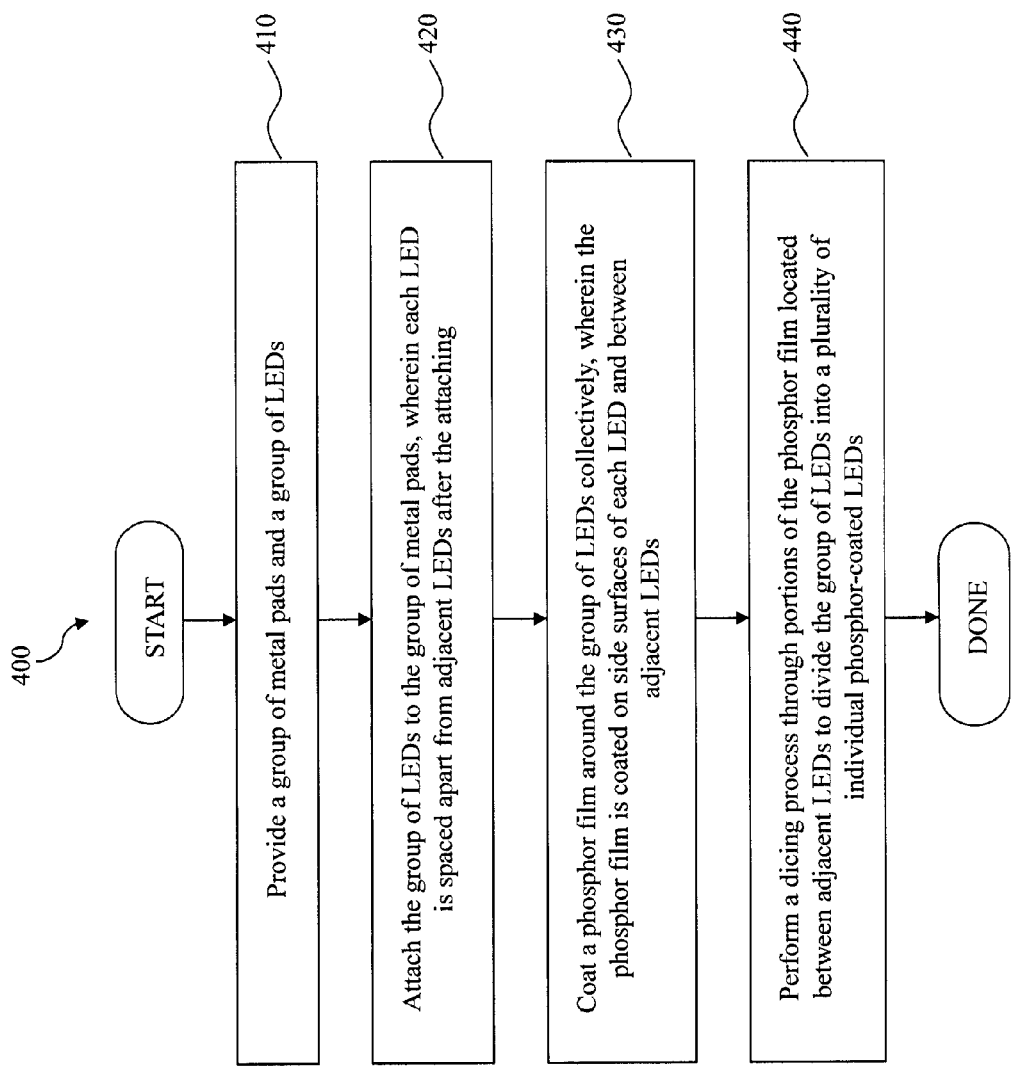
FIG. 14 is a flowchart illustrating a method of packaging an LED according to various aspects of the present disclosure.

FIG. 14 is a flowchart of a method 400 for packaging an LED according to various aspects of the present disclosure. The method 400 includes a step 410, in which a group of metal pads and a group of LEDs are provided. In some embodiments, the group of LED is provided by: obtaining a plurality of LEDs, followed by assigning the plurality of LEDs into different bins according to their performance characteristics, and then choosing one or more bins of LEDs as the group of LEDs. In some embodiments, the metal pads are lead frames.

The method 400 includes a step 420, in which the group of LEDs is attached to the group of metal pads. Each LED is spaced apart from adjacent LEDs. In some embodiments, the step 420 is performed so that each LED is attached to two of the respective metal pads that are physically separated from each other. For each LED, one of the two metal pads is attached to a p-terminal of the LED, and the other one of the two metal pads is attached to an n-terminal of the LED.

The method 400 includes a step 430, in which a phosphor film is coated around the group of LEDs collectively. The phosphor film is coated on top and side surfaces of each LED and between adjacent LEDs. The method 400 includes a step 440, in which a dicing process is performed to dice through portions of the phosphor film located between adjacent LEDs, so as to divide the group of LEDs into a plurality of individual phosphor-coated LEDs.

Additional processes may be performed before, during, or after the blocks 410-440 discussed herein to complete the fabrication of the lighting apparatus. For the sake of simplicity, these additional processes are not discussed herein.

Figure 15:
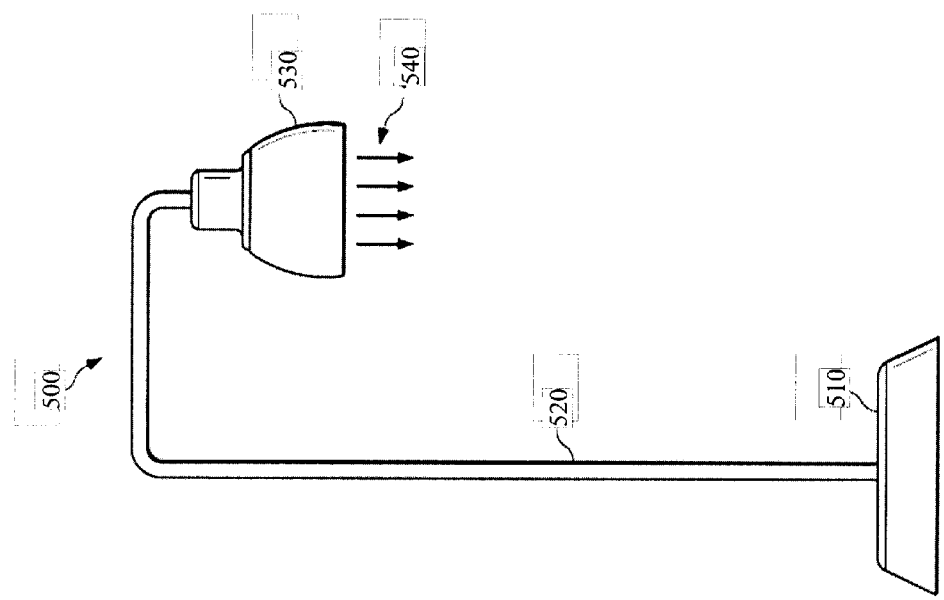
FIG. 15 is a diagrammatic view of a lighting module that includes a plurality of phosphor-coated LED dies according to various aspects of the present disclosure.

FIG. 15 illustrates a simplified diagrammatic view of a lighting module 500 that includes some embodiments of the lighting instrument 240A discussed above. The lighting module 500 has a base 510, a body 520 attached to the base 510, and a lamp 530 attached to the body 520. In some embodiments, the lamp 530 is a down lamp (or a down light lighting module).

The lamp 530 includes the lighting instrument 240A (and the single junction phosphor-coated LED chips) discussed above with reference to FIGS. 1-14. In other words, the lamp 530 of the lighting module 500 includes an LED-based light source, wherein the LED dies are phosphor coated in a localized manner. The LED packaging for the lamp 530 is configured to produce a light output 540.

One of the broader forms of the present disclosure involves a method. The method involves: bonding a plurality of light-emitting dies to a plurality of conductive pads; applying a phosphor material on the plurality of light-emitting dies in a manner such that spaces between adjacent light-emitting dies are filled with the phosphor material; and separating the plurality of light-emitting dies from one another, thereby forming a plurality of phosphor-coated light-emitting dies, wherein each light-emitting die has the phosphor material coated on a top surface and side surfaces of the light-emitting die.

In some embodiments, the bonding is performed so that the plurality of light-emitting dies are physically spaced apart from one another; and the separating includes dicing the phosphor materials that fill the spaces between the adjacent light-emitting dies.

In some embodiments, the bonding is performed so that each light-emitting die is bonded to two of the respective conductive pads that are spaced apart from one another. In some embodiments, each light-emitting die includes a p-terminal and an n-terminal; the p-terminal is bonded to one of the conductive pads; and the n-terminal is bonded to the other one of the conductive pads.

In some embodiments, the method further includes: before the bonding, performing a binning process to a further plurality of light-emitting dies; and selecting, in response to results of the binding process, a subset of the further plurality of the light-emitting dies as the plurality of the light-emitting dies for bonding.

In some embodiments, the method further includes: fabricating a lighting module using one or more of the phosphor-coated light-emitting dies as its light source. In some embodiments, the fabricating the lighting module comprises: attaching the one or more of the phosphor-coated light-emitting dies to a substrate; applying a transparent and diffusive gel over the substrate and over the one or more phosphor-coated light-emitting dies; and installing a diffuser cap over the substrate, the diffuser cap housing the one or more phosphor-coated light-emitting dies and the transparent and diffusive gel within.

In some embodiments, the plurality of conductive pads are located on a submount, and wherein the separating includes dividing the submount into a plurality of submount pieces so that each phosphor-coated light-emitting die is attached to a respective submount piece.

In some embodiments, each of the conductive pads includes a lead frame.

In some embodiments, the plurality of conductive pads is attached to a substrate through a tape, and further comprising: removing the tape and the substrate before the separating.

In some embodiments, the light-emitting dies include light-emitting diodes (LEDs).

Another one of the broader forms of the present disclosure involves a method of packaging a light-emitting diode (LED). The method includes: providing a group of metal pads and a group of LEDs, wherein the metal pads include lead frames; attaching the group of LEDs to the group of metal pads, wherein each LED is spaced apart from adjacent LEDs after the attaching; coating a phosphor film around the group of LEDs collectively, wherein the phosphor film is coated on top and side surfaces of each LED and between adjacent LEDs; and performing a dicing process through portions of the phosphor film located between adjacent LEDs to divide the group of LEDs into a plurality of individual phosphor-coated LEDs.

In some embodiments, the attaching is performed so that each LED is attached to two of the respective metal pads that are physically separated from each other.

In some embodiments, for each LED: one of the two metal pads is attached to a p-terminal of the LED, and the other one of the two metal pads is attached to an n-terminal of the LED.

In some embodiments, the providing the group of LEDs includes: obtaining a plurality of LEDs; assigning the plurality of LEDs into different bins according to their performance characteristics; and choosing one or more bins of LEDs as the group of LEDs.

In some embodiments, the providing, the attaching, the coating, and the dicing are performed in a substrate-less manner.

In some embodiments, the LEDs are substantially evenly spaced apart after the attaching.

In some embodiments, the method further includes applying solder paste on the metal pads before the attaching Yet another one of the broader forms of the present disclosure involves a light-emitting diode (LED) lighting apparatus. The LED lighting apparatus includes: a substrate; a plurality of additional phosphor-coated LED chips that are located on the substrate, wherein the LED chips are physically separated from adjacent LED chips, and wherein each LED chip includes: an LED die; two conductive pads each bonded to the LED die; and a phosphor film coated conformally around the LED die, such that the LED die has the phosphor film coated on its top and side surfaces.

In some embodiments, the LED lighting apparatus further includes: a thermal dissipation structure thermally conductively coupled to the substrate; a diffuser cap located over the substrate and housing the LED chips underneath; and an optical gel disposed between the LED chips and the diffuser cap.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A method, comprising:
bonding a plurality of light-emitting dies to a plurality of conductive pads;
applying a phosphor material on the plurality of light-emitting dies in a manner such that spaces between adjacent light-emitting dies are filled with the phosphor material;
separating the plurality of light-emitting dies from one another, thereby forming a plurality of phosphor-coated light-emitting dies, wherein each light-emitting die has the phosphor material coated on a top surface and side surfaces of the light-emitting die; and
fabricating a lighting module using one or more of the phosphor-coated light-emitting dies as its light source, wherein the fabricating the lighting module comprises:
attaching the one or more of the phosphor-coated light-emitting dies to a substrate;

applying a transparent and diffusive gel over the substrate and over the one or more phosphor-coated light-emitting dies; and installing a diffuser cap over the substrate, the diffuser cap housing the one or more phosphor-coated light-emitting dies and the transparent and diffusive gel within.

2. The method of claim 1, wherein:

the bonding is performed so that the plurality of light-emitting dies are physically spaced apart from one another; and the separating includes dicing the phosphor materials that fill the spaces between the adjacent light-emitting dies.

3. The method of claim 1, wherein the bonding is performed so that each light-emitting die is bonded to two of the respective conductive pads that are spaced apart from one another.

4. The method of claim 3, wherein:

each light-emitting die includes a p-terminal and an n-terminal;

the p-terminal is bonded to one of the conductive pads; and the n-terminal is bonded to the other one of the conductive pads.

5. The method of claim 1, further comprising:

before the bonding, performing a binning process to a further plurality of light-emitting dies; and selecting, in response to results of the binding process, a subset of the further plurality of the light-emitting dies as the plurality of the light-emitting dies for bonding.

6. The method of claim 1, wherein the plurality of conductive pads are located on a submount, and wherein the separating includes dividing the submount into a plurality of submount pieces so that each phosphor-coated light-emitting die is attached to a respective submount piece.

7. The method of claim 1, wherein each of the conductive pads includes a lead frame.

8. The method of claim 1, wherein the plurality of conductive pads is attached to a substrate through a tape, and further comprising: removing the tape and the substrate before the separating.

9. The method of claim 1, wherein the light-emitting dies include light-emitting diodes (LEDs).

10. A method of packaging a light-emitting diode (LED), comprising:

providing a group of LEDs bonded to a group of metal pads, respectively, wherein the group of metal pads is attached to a substrate through a tape;

coating a phosphor film around the group of LEDs collectively, wherein the phosphor film is coated on top and side surfaces of each LED and between adjacent LEDs;

removing the tape and the substrate after the coating of the phosphor film; and thereafter performing a dicing process through portions of the phosphor film located between adjacent LEDs to divide the group of LEDs into a plurality of individual phosphor-coated LEDs.

11. The method of claim 10, wherein each LED is attached to two of the respective metal pads that are physically separated from each other.

12. The method of claim 11, wherein for each LED: one of the two metal pads is attached to a p-terminal of the LED, and the other one of the two metal pads is attached to an n-terminal of the LED.

13. The method of claim 10, wherein the providing the group of LEDs comprises:

obtaining a plurality of LEDs;

assigning the plurality of LEDs into different bins according to their performance characteristics; and choosing one or more bins of LEDs as the group of LEDs.

14. The method of claim 10, wherein the LEDs are substantially evenly spaced apart.

15. The method of claim 10, further comprising bonding the group of LEDs to the group of metal pads through solder paste.

16. A method, comprising:

disposing a tape on a substrate;

disposing a plurality of light-emitting diode (LED) dies on the tape;

applying a phosphor material over top and side surfaces of the plurality of LED dies, wherein the applying is performed in a manner such that spaces between adjacent LED dies are filled with the phosphor material, thereby forming phosphor-coated LED dies on the tape;

removing the phosphor-coated LED dies from the tape; and thereafter performing a dicing process to separate the phosphor-coated LED dies from one another.

17. The method of claim 16, wherein the dicing process includes dicing the phosphor material disposed in spaces between the adjacent LED dies.

18. The method of claim 16, wherein each LED die includes a p-terminal and an n-terminal that are each electrically coupled to a respective bonding pad.

19. The method of claim 16, further comprising: performing a binning process to a group of LED dies to select the plurality of LED dies to be disposed on the tape.

20. The method of claim 16, wherein the substrate includes a silicon substrate, a ceramic substrate, or a gallium nitride substrate.

* * * * *